United States Patent [19]
Trost et al.

[11] Patent Number: 6,075,824
[45] Date of Patent: Jun. 13, 2000

[54] METHOD AND APPARATUS FOR RE-ENCODING DECODED DATA

[75] Inventors: Theodore A. Trost, Buffalo Grove; Terry M. Schaffner, Palatine, both of Ill.

[73] Assignee: Motorola, Inc., Schaumburg, Ill.

[21] Appl. No.: 08/905,455

[22] Filed: Aug. 4, 1997

[51] Int. Cl.[7] ...................................................... H03K 9/00
[52] U.S. Cl. .......................... 375/316; 375/262; 375/265; 375/341
[58] Field of Search ..................................... 375/200, 206, 375/208, 209, 210, 316, 341, 262, 263, 265; 370/209, 342, 335

[56] References Cited

U.S. PATENT DOCUMENTS

| | | | |
|---|---|---|---|
| 5,134,635 | 7/1992 | Hong et al. ............................. | 375/341 |
| 5,442,627 | 8/1995 | Viterbi et al. ........................... | 370/209 |
| 5,862,190 | 1/1999 | Schaffner ................................ | 375/341 |

*Primary Examiner*—Stephen Chin
*Assistant Examiner*—Chieh M. Fan
*Attorney, Agent, or Firm*—Sayed Hossain Beladi

[57] ABSTRACT

A re-encoded history data bits generator (101), in a communication system having a block of convolutionally encoded data bits that are interleaved into a matrix (200), selects, for each of the required number of re-encoded history data bits, a combination of data bits from a sequence of previously decoded data bits (410). The position of data bits in each combination is predetermined relative to the position of a data bit last shifted into in the sequence (410). The re-encoder encodes the combinations of the selected data bits thereby producing the re-encoded history data bits. The data bits of each combination are at consecutive positions in the sequence (410). The data bits of an encoded word constitute each row of the matrix (200).

14 Claims, 5 Drawing Sheets

—PRIOR ART—

| 1 | 2 | 3 | 4 | 5 | 6 | |
|---|---|---|---|---|---|---|
| $g_0$ ($S_{001}$) | $g_2$ ($S_{011}$) | $g_1$ ($S_{022}$) | $g_0$ ($S_{033}$) | $g_2$ ($S_{043}$) | $g_1$ ($S_{054}$) | 1 |
| $g_1$ ($S_{001}$) | $g_0$ ($S_{012}$) | $g_2$ ($S_{022}$) | $g_1$ ($S_{033}$) | $g_0$ ($S_{044}$) | $g_2$ ($S_{054}$) | 2 |
| $g_2$ ($S_{001}$) | $g_1$ ($S_{012}$) | $g_0$ ($S_{023}$) | $g_2$ ($S_{033}$) | $g_1$ ($S_{044}$) | $g_0$ ($S_{055}$) | 3 |
| $g_0$ ($S_{002}$) | $g_2$ ($S_{012}$) | $g_1$ ($S_{023}$) | $g_0$ ($S_{034}$) | $g_2$ ($S_{044}$) | $g_1$ ($S_{055}$) | 4 |
| $g_1$ ($S_{002}$) | $g_0$ ($S_{013}$) | $g_2$ ($S_{023}$) | $g_1$ ($S_{034}$) | $g_0$ ($S_{045}$) | $g_2$ ($S_{055}$) | 5 |
| $g_2$ ($S_{002}$) | $g_1$ ($S_{013}$) | $g_0$ ($S_{024}$) | $g_2$ ($S_{034}$) | $g_1$ ($S_{045}$) | $g_0$ ($S_{056}$) | 6 |
| $g_0$ ($S_{003}$) | $g_2$ ($S_{013}$) | $g_1$ ($S_{024}$) | $g_0$ ($S_{035}$) | $g_2$ ($S_{045}$) | $g_1$ ($S_{056}$) | 7 |
| $g_1$ ($S_{003}$) | $g_0$ ($S_{014}$) | $g_2$ ($S_{024}$) | $g_1$ ($S_{035}$) | $g_0$ ($S_{046}$) | $g_2$ ($S_{056}$) | 8 |
| $g_2$ ($S_{003}$) | $g_1$ ($S_{014}$) | $g_0$ ($S_{025}$) | $g_2$ ($S_{035}$) | $g_1$ ($S_{046}$) | $g_0$ ($S_{057}$) | 9 |
| $g_0$ ($S_{004}$) | $g_2$ ($S_{014}$) | $g_1$ ($S_{025}$) | $g_0$ ($S_{036}$) | $g_2$ ($S_{046}$) | $g_1$ ($S_{057}$) | 10 |
| $g_1$ ($S_{004}$) | $g_0$ ($S_{015}$) | $g_2$ ($S_{025}$) | $g_1$ ($S_{036}$) | $g_0$ ($S_{047}$) | $g_2$ ($S_{057}$) | 11 |
| $g_2$ ($S_{004}$) | $g_1$ ($S_{015}$) | $g_0$ ($S_{026}$) | $g_2$ ($S_{036}$) | $g_1$ ($S_{047}$) | $g_0$ ($S_{058}$) | 12 |
| $g_0$ ($S_{005}$) | $g_2$ ($S_{015}$) | $g_1$ ($S_{026}$) | $g_0$ ($S_{037}$) | $g_2$ ($S_{047}$) | $g_1$ ($S_{058}$) | 13 |
| $g_1$ ($S_{005}$) | $g_0$ ($S_{016}$) | $g_2$ ($S_{026}$) | $g_1$ ($S_{037}$) | $g_0$ ($S_{048}$) | $g_2$ ($S_{058}$) | 14 |
| $g_2$ ($S_{005}$) | $g_1$ ($S_{016}$) | $g_0$ ($S_{027}$) | $g_2$ ($S_{037}$) | $g_1$ ($S_{048}$) | $g_0$ ($S_{059}$) | 15 |
| $g_0$ ($S_{006}$) | $g_2$ ($S_{016}$) | $g_1$ ($S_{027}$) | $g_0$ ($S_{038}$) | $g_2$ ($S_{048}$) | $g_1$ ($S_{059}$) | 16 |
| $g_1$ ($S_{006}$) | $g_0$ ($S_{017}$) | $g_2$ ($S_{027}$) | $g_1$ ($S_{038}$) | $g_0$ ($S_{049}$) | $g_2$ ($S_{059}$) | 17 |
| $g_2$ ($S_{006}$) | $g_1$ ($S_{017}$) | $g_0$ ($S_{028}$) | $g_2$ ($S_{038}$) | $g_1$ ($S_{049}$) | $g_0$ ($S_{060}$) | 18 |
| $g_0$ ($S_{007}$) | $g_2$ ($S_{017}$) | $g_1$ ($S_{028}$) | $g_0$ ($S_{039}$) | $g_2$ ($S_{049}$) | $g_1$ ($S_{060}$) | 19 |
| $g_1$ ($S_{007}$) | $g_0$ ($S_{018}$) | $g_2$ ($S_{028}$) | $g_1$ ($S_{039}$) | $g_0$ ($S_{050}$) | $g_2$ ($S_{060}$) | 20 |
| $g_2$ ($S_{007}$) | $g_1$ ($S_{018}$) | $g_0$ ($S_{029}$) | $g_2$ ($S_{039}$) | $g_1$ ($S_{050}$) | $g_0$ ($S_{061}$) | 21 |
| $g_0$ ($S_{008}$) | $g_2$ ($S_{018}$) | $g_1$ ($S_{029}$) | $g_0$ ($S_{040}$) | $g_2$ ($S_{050}$) | $g_1$ ($S_{061}$) | 22 |
| $g_1$ ($S_{008}$) | $g_0$ ($S_{019}$) | $g_2$ ($S_{029}$) | $g_1$ ($S_{040}$) | $g_0$ ($S_{051}$) | $g_2$ ($S_{061}$) | 23 |
| $g_2$ ($S_{008}$) | $g_1$ ($S_{019}$) | $g_0$ ($S_{030}$) | $g_2$ ($S_{040}$) | $g_1$ ($S_{051}$) | $g_0$ ($S_{062}$) | 24 |
| $g_0$ ($S_{009}$) | $g_2$ ($S_{019}$) | $g_1$ ($S_{030}$) | $g_0$ ($S_{041}$) | $g_2$ ($S_{051}$) | $g_1$ ($S_{062}$) | 25 |
| $g_1$ ($S_{009}$) | $g_0$ ($S_{020}$) | $g_2$ ($S_{030}$) | $g_1$ ($S_{041}$) | $g_0$ ($S_{052}$) | $g_2$ ($S_{062}$) | 26 |
| $g_2$ ($S_{009}$) | $g_1$ ($S_{020}$) | $g_0$ ($S_{031}$) | $g_2$ ($S_{041}$) | $g_1$ ($S_{052}$) | $g_0$ ($S_{063}$) | 27 |
| $g_0$ ($S_{010}$) | $g_2$ ($S_{020}$) | $g_1$ ($S_{031}$) | $g_0$ ($S_{042}$) | $g_2$ ($S_{052}$) | $g_1$ ($S_{063}$) | 28 |
| $g_1$ ($S_{010}$) | $g_0$ ($S_{021}$) | $g_2$ ($S_{031}$) | $g_1$ ($S_{042}$) | $g_0$ ($S_{053}$) | $g_2$ ($S_{063}$) | 29 |
| $g_2$ ($S_{010}$) | $g_1$ ($S_{021}$) | $g_0$ ($S_{032}$) | $g_2$ ($S_{042}$) | $g_1$ ($S_{053}$) | $g_0$ ($S_{064}$) | 30 |
| $g_0$ ($S_{011}$) | $g_2$ ($S_{021}$) | $g_1$ ($S_{032}$) | $g_0$ ($S_{043}$) | $g_2$ ($S_{053}$) | $g_1$ ($S_{064}$) | 31 |
| $g_1$ ($S_{011}$) | $g_0$ ($S_{022}$) | $g_2$ ($S_{032}$) | $g_1$ ($S_{043}$) | $g_0$ ($S_{054}$) | $g_2$ ($S_{064}$) | 32 |

FIG. 2

METHOD AND APPARATUS FOR RE-ENCODING DECODED DATA

FIELD OF THE INVENTION

The present invention relates to a method of generating re-encoded history data bits, more particularly, in a convolutional decoder.

BACKGROUND OF THE INVENTION

In a Code Division Multiplex Access (CDMA) communication system, data bits are convolutionally encoded, interleaved and modulated onto a carrier before the modulated carrier is transmitted. The encoding function is based on a convolutional coding scheme with a constraint length of a plurality of data bits which are inputs into a convolutional encoder having a plurality of generator functions. The number of generator functions is defined by the convolutional coding rate. A data register having a length equal to the number of data bits as the constraint length in a first-in-first-out fashion shifts the information data across the encoder inputs, and for every shift, a branch word is generated by the encoder. Each branch word has a number of data bits equal to the number of the generator functions. At the receiving end, the signal is demodulated and decoded by a correlation receiver to extract the information.

In the prior art, a correlation receiver determines decoded bit metrics for each branch word generated without considering the dependency among encoded bits. Improvement in receiver sensitivity is obtained by redefining the means by which each bit metric is determined by taking into account inter-bit dependencies. A correlation receiver disclosed by Schaffner in patent application Ser. No. 08/581,696, filed on Dec. 29, 1995, assigned to the assignee of the present application, and incorporated herein by reference, takes into account such interdependency by relating the previously decoded bits to the branch word being decoded.

To incorporate the previously decoded bits in the decoding function, the previously decoded bits must be re-encoded. With reference to FIG. 1, a block diagram of Maximum Conditional Likelihood Decoder 100 as disclosed by Schaffner is shown. The previously decoded bits are formed into a sequence of history data bits at 107. A convolutional re-encoder 101 generates the re-encoded history data bits at 103 for each branch word being decoded. The sequence of history data bits gets longer as decoder 100 decodes subsequent branch words. The re-encoder 101, therefore, is required to keep track of the sequence and the required locations of re-encoder input taps in order to produce re-encoded history bits related to the branch word being decoded.

To generate re-encoded history data bits by utilizing storage elements, large amounts of storage elements are required. This implementation has been discouraged due to increasing number of the storage elements and the time required to write and read the data from the storage elements. In an implementation that does not require any storage elements, the entire history data bits at each decoding time step is re-encoded for finding and selecting the proper portions of the path history that relate to the branch word being decoded. This method, however, is not practical since the amount of calculation for each re-encoding operation creates unacceptable latency in producing the results.

Therefore, there is a need for an efficient method of generating re-encoded history data bits without re-encoding the entire history of data bits.

BRIEF DESCRIPTION OF THE DRAWINGS

FIG. 2 depicts a matrix of encoded data bits.

DETAILED DESCRIPTION OF THE PREFERRED EMBODIMENT

A re-encoded history data bits generator, in a communication system having a block of convolutionally encoded data bits that are interleaved into a matrix, selects, for each of the required number of re-encoded history data bits, a combination of data bits from a sequence of previously decoded data bits. The position of data bits in each combination is predetermined relative to the position of a data bit last shifted into in the sequence. The re-encoder encodes the combinations of the selected data bits thereby producing the re-encoded history data bits. The data bits of each combination are at consecutive positions in the sequence. The data bits of an encoded word constitute each row of the matrix.

In a communication system for communicating a block of data, an encoder convolutionally encodes each data bit of the block into a branch word according to a coding rate. The encoder has a constraint length of a plurality of data bits. The branch words are interleaved into a matrix having a plurality of rows and columns.

With reference to FIG. 2, such a matrix is shown at 200. The block of data consists of 64 data bits. In this example, the coding rate is selected to be at a rate of three; therefore, three bits are generated by the encoder to represent a branch word. The branch words are interleaved, in a contiguous manner, into the matrix 200 in the plurality of columns labeled 1–6. The matrix 200 has six columns and thirty two rows, the first and the last branch words are shown respectively at 201 and 264. The contiguous order of the branch words in matrix 200 is shown by consecutive numbers after designator "S".

Figure 1:
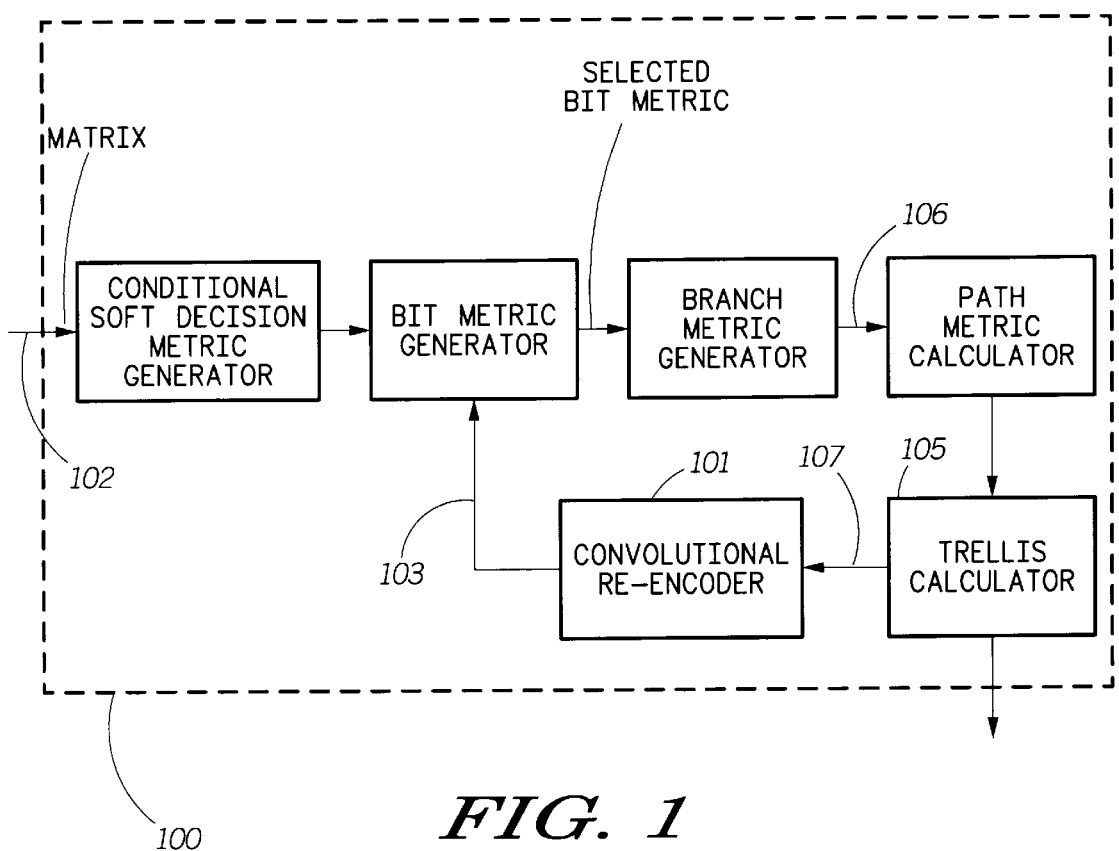
FIG. 1 depicts a decoder for decoding encoded data based on re-encoded decoded data bits.

A decoder, like decoder 100 as shown in FIG. 1, receiving matrix 200 at 102 decodes each of the plurality of branch words and produces accordingly a decoded bit. Each decoded bit is shifted into a sequence of previously decoded data bits to form a sequence of decoded history data bits. The decoder decodes in contiguous order each of the plurality of branch words starting at 201 and continuing down each column. Where the decoding in 100 is based on re-encoded history data bits, the present invention provides a method of producing the re-encoded history data bits in a convolutional re-encoder 101.

The present invention is a method for producing re-encoded history data bits by first selecting a combination of previously decoded data bits that are at predetermined positions in the sequence relative to the position of a decoded data bit that was last shifted into the sequence. The re-encoded history data bits are then produced by re-encoding the selected combinations of previously decoded data bits. The positions of the selected combinations of the data bits remain the same for every branch word being decoded even though data bits, as the result of producing new decoded data bits, have been shifted in the sequence.

Figure 3:
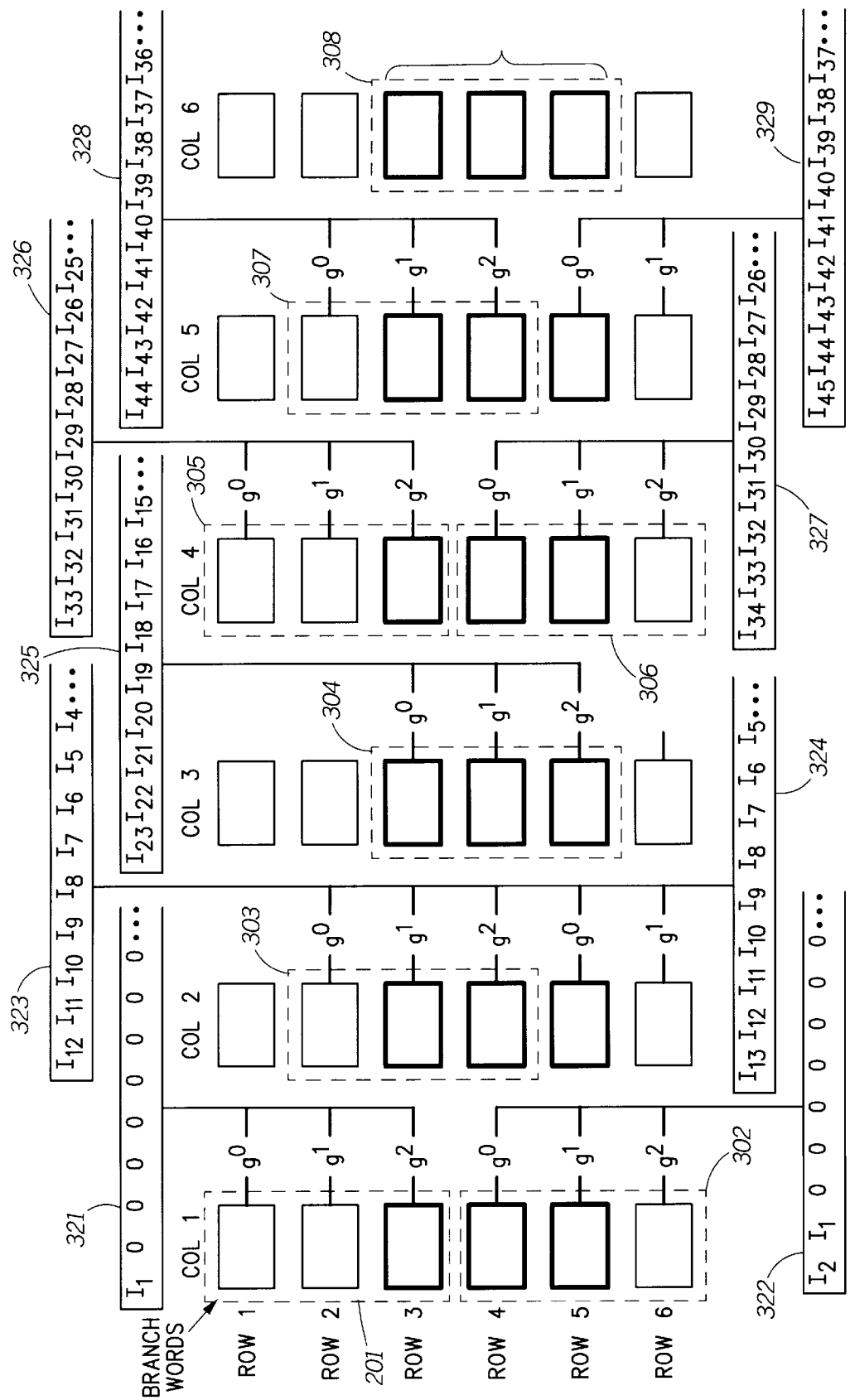
FIG. 3 depicts a portion of a matrix of encoded data and a partial sequence of history data bits at each branch word being decoded.

With reference to FIG. 3, the first six rows and columns of matrix 200 are shown. In the first column, the first and second branch words are shown at 201 and 302. Each branch word consists of three bits representing the coding rate and the generator functions g0, g1 and g2. When the first branch word 201 is decoded, the decoded bit is shifted into the sequence as "I1" as shown in 321. Likewise, when branch word 302 is decoded, the decoded bit is shifted into the sequence as "I2", and "I1" is shifted down by one position as shown in 322. The process of shifting the decoded bits takes place every time a branch word is decoded. In another example, when the 44th branch word 307 is decoded, the decoded bit "I44" is shifted into the sequence as shown at 328, and all previously decoded bits are shifted down in the sequence by one position. The sequence created by decoding the 45th branch word is shown at 329.

According to the present invention, the required number of re-encoded history data bits is determined to be equal to a number of columns preceding the column where the branch word being decoded is located in the matrix. For branch words located entirely in the first column, there is no requirement for generating re-encoded history data bits. A unique combination of data bits is selected from the sequence for each of the required number of re-encoded history data bits. The position of each of the selected combination of bits in the sequence are predetermined and fixed relative to the position of the last decoded bit shifted into the sequence.

Figure 4:
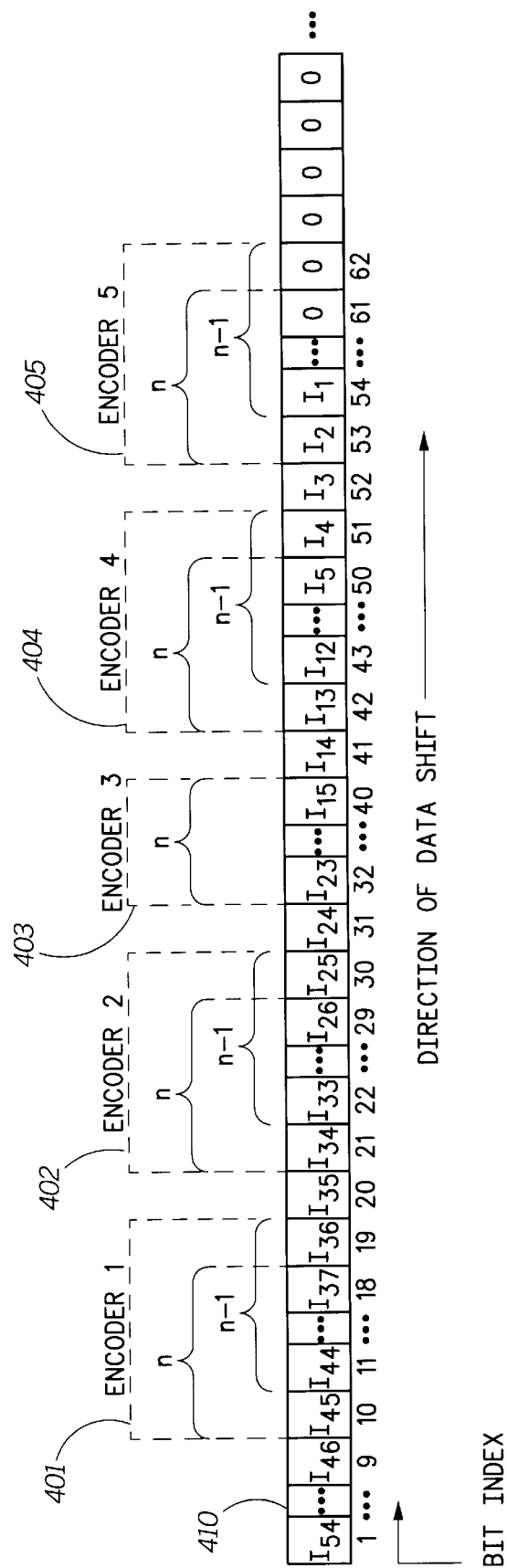
FIG. 4 depicts positions of selected history data bits for re-encoding functions.

For example in FIG. 3, where the 55th branch word 308 is located in column 6, the required number of the re-encoded history data bits is equal to five. With reference to FIG. 3 and FIG. 4, the entire sequence of history data bits immediately preceding the 55th branch word 308 is shown at 410. Accordingly, five combinations of data bits, 401–405, are selected at predetermined positions from the sequence to be re-encoded by respectively five re-encoders.

Where the number of rows is not a multiple integer of the coding rate as shown in FIG. 2, the data bits of at least one of the branch words are placed in at least two columns such that data bits of a branch word begin in one column and ends in the next. For example, the data bits of the 11th branch word, identified as "S011" in matrix 200, are located in the first and second columns. In this case in accordance with the present invention, the number of required re-encoders is determined for each data bit of the branch word being decoded. In case of the branch word "S011", the data bits "g0" and "g1" do not require any re-encoding since they are in the first column; however, the data bit "g2" requires one re-encoder. In another example, the branch word "S043" requires three re-encoders for the first two data bits, and four re-encoders for the last data bit.

In accordance with the present invention, the selected combination of data bits are in consecutive positions in the sequence, as shown in FIG. 4 at 401–405.

Furthermore, where the selected combination of data bits includes two sub-combinations of consecutive data bits, the positions of the sub-combinations are shifted by one bit from each other in the sequence, as shown in FIG. 4 at 401, 402, 404 and 405. In one aspect of the present invention, the selected combination of data bits includes a number of data bits equal to the number of data bits used in the constraint length of the communication system encoder. In the preferred embodiment, the constraint length is nine bits. In case of selecting sub-combinations of data bits, each sub-combination includes a number of data bits equal to the constraint length.

The size of the matrix is usually set by the size of the block of data and the coding rate. In a preferred embodiment of the present invention, data bits in each row are encoded into an encoded word. The encoded word in an implementation is a modulation symbol according to IS-95 standards. In this case, the matrix is interleaved to have a number of columns equal to the number of data bits in the modulation symbol. The modulation symbol is six bits long. For more information on IS-95 standards, see TIA/EIA/IS-95, Mobile Station-Base Station Compatibility Standard for Dual Mode Wideband Spread Spectrum Cellular System, July 1993, herein incorporated by reference. Thus, the number of columns of the matrix is fixed by the size of the modulation symbol or the encoded word. Either coding rate two or three may be used, according to the IS-95 standards. A branch word consists of two bits if a coding rate of two is used.

The number of columns in the matrix may be extended to be a multiple integer of the modulation symbol forming a plurality of matrices when the transmission of the block of data is interleaved as such. In this case, a matrix, like the matrix 200, is one of the plurality of matrices.

Figure 5:
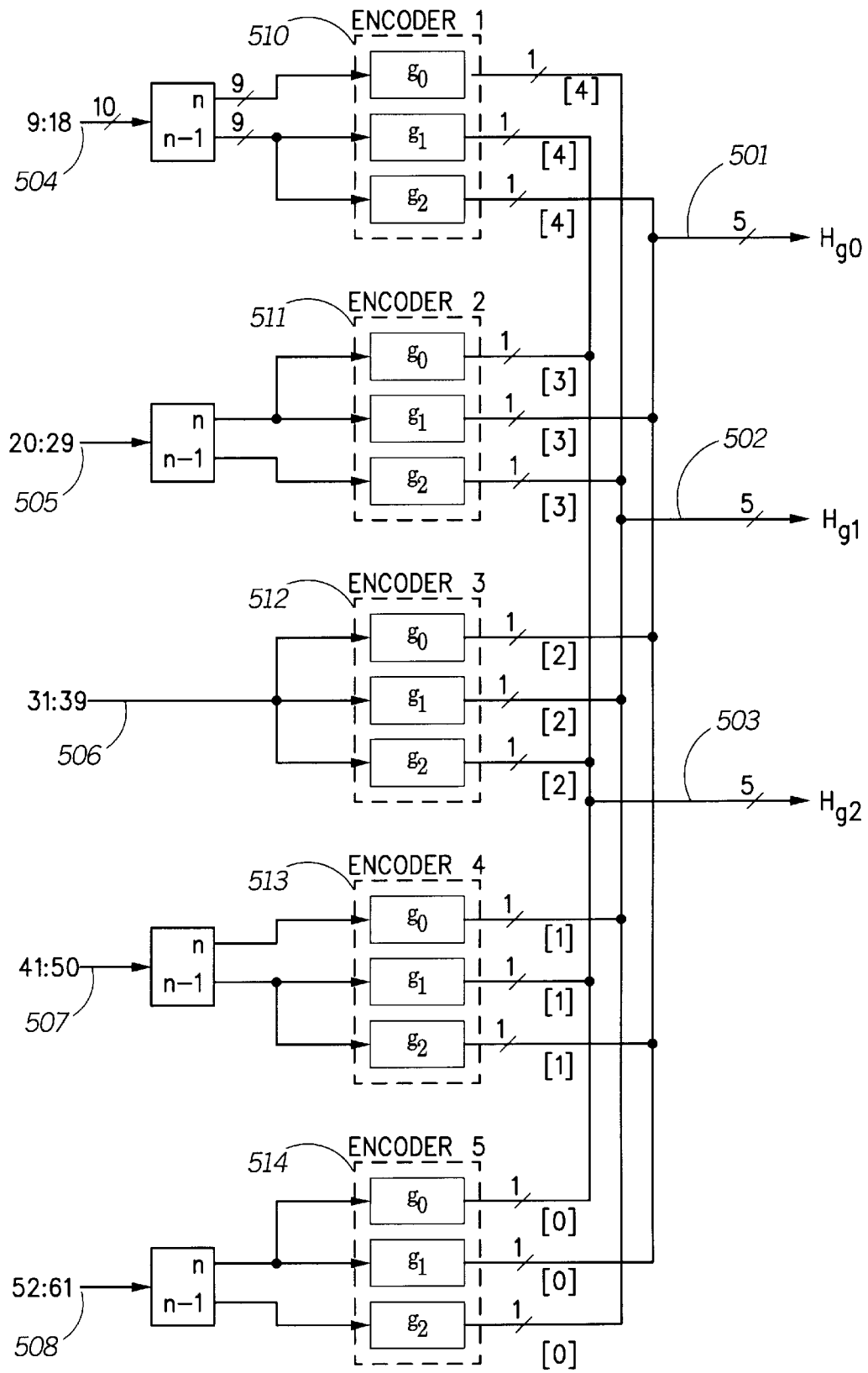
FIG. 5 depicts an apparatus for the re-encoding function.

With reference to FIG. 5, a block diagram of an apparatus for generating the re-encoded history data bits is shown. Where there are three generator functions, each encoder, 510–514, has that corresponding number of generator functions. The input to each encoder is shown at 504–508. Each encoder has a unique combination of input data bits as shown. The "9:18" indicates the data bits at bit index 9 through 18 as shown in FIG. 4. The re-encoder as shown in FIG. 5 groups corresponding generator functions g0, g1, and g2 outputs at 501, 502 and 503 respectively for the decoding branch word having corresponding generator functions.

While the invention has been particularly shown and described with reference to a particular embodiment, it will be understood by those skilled in the art that various changes in form and details may be made therein without departing from the spirit and scope of the invention. The corresponding structures, materials, acts and equivalents of all means or step plus function elements in the claims below are intended to include any structure, material, or acts for performing the functions in combination with other claimed elements as specifically claimed.

What is claimed is:

1. In a communication system for communicating a block of data, each data bit of said block of data being convolutionally encoded into a branch word according to a coding rate by an encoder having a constraint length of a plurality of data bits to generate a plurality of branch words which are interleaved into a matrix having a plurality of rows and columns, where a decoder receives said matrix and decodes each of said plurality of branch words to produce a sequence of history data bits by shifting a decoded data bit into said sequence every time one of said plurality of branch words is decoded, where said decoder decodes based on re-encoded history data bits, a method for producing said re-encoded history data bits comprising the steps of:

selecting a combination of data bits that are at predetermined positions in said sequence of history data bits relative to a position of a decoded data bit last shifted into said sequence;

re-encoding said selected combination of data bits to produce said re-encoded history data bits;

determining a required number of re-encoded history data bits based on a location of the branch word being decoded in said matrix.

2. The method as recited in claim 1 wherein said branch words are interleaved into said matrix by placing said branch words contiguously in said plurality of columns and said decoder decodes in contiguous order each of said plurality of branch words.

3. The method as recited in claim 1, further comprising the steps of:
   repeating said re-encoding step for each of said required number of re-encoded history data bits.

4. The method as recited in claim 1 wherein in said selecting step a unique combination of data bits is selected from said sequence for each of said required number of re-encoded history data bits.

5. The method as recited in claim 1 wherein said required number of re-encoded history data bits is determined in said determining step to be equal to a number of columns preceding to a column where data bits of the branch word being decoded are located in said matrix.

6. The method as recited in claim 5 wherein said required number of re-encoded history data bits is determined in said determining step for each data bit of the branch word being decoded where data bits of the branch word being decoded are located in a subset of said plurality of columns of said matrix.

7. The method as recited in claim 1 wherein said selected combination of data bits are in consecutive positions in said sequence.

8. The method as recited in claim 7 wherein said selected combination of data bits includes two sub-combinations of data bits and positions of said sub-combinations are shifted by one bit from each other in said sequence.

9. The method as recited in claim 8 wherein each of said selected sub-combinations of data bits includes a number of data bits equal to said constraint length.

10. The method as recited in claim 1 wherein data bits in each row of said matrix are encoded into an encoded word.

11. The method as recited in claim 1 wherein data bits in each row of said matrix constitutes a modulation symbol.

12. The method as recited in claim 1 wherein said plurality of branch words are interleaved into a plurality of matrices and said matrix is one of said plurality of matrices.

13. A receiver, comprising:
   means for receiving a matrix of encoded data bits including a plurality of branch words;
   means for decoding encoded data bits of said matrix to produce a sequence of previously decoded data bits;
   means for selecting a plurality of data bits at predetermined positions in said sequence of previously decoded data bits;
   means for re-encoding said selected plurality of data bits to produce re-encoded history data bits; and
   means for determining a required number of re-encoded history data bits based on a location of one of the branch words being decoded in said matrix.

14. An apparatus for re-encoding a plurality of data bits, comprising;
   means for selecting said plurality of data located at predetermined positions in a sequence of previously decoded data bits;
   means for re-encoding said selected plurality of data according to a plurality of generator functions;
   means for determining a required number of re-encoded data based on said predetermined positions in said sequence of previously decoded data bits; and
   means for outputting a plurality of re-encoded data, and grouping said plurality of re-encoded data according to said plurality of generator functions.

* * * * *